US009425753B2

(12) United States Patent
Robinett et al.

(10) Patent No.: US 9,425,753 B2
(45) Date of Patent: Aug. 23, 2016

(54) LOW-NOISE AMPLIFIER MATCHING

(71) Applicant: QUALCOMM Incorporated, San Diego, CA (US)

(72) Inventors: Robert Lloyd Robinett, San Diego, CA (US); Ali Morshedi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 74 days.

(21) Appl. No.: 14/074,612

(22) Filed: Nov. 7, 2013

(65) Prior Publication Data

US 2015/0126136 A1   May 7, 2015

(51) Int. Cl.
H04B 1/40 (2015.01)
H03F 3/195 (2006.01)
H03F 1/56 (2006.01)
H03F 3/19 (2006.01)
H03F 3/72 (2006.01)
H03H 7/40 (2006.01)
H04B 1/18 (2006.01)
H03J 5/24 (2006.01)

(52) U.S. Cl.
CPC ............... *H03F 3/195* (2013.01); *H03F 1/565* (2013.01); *H03F 3/19* (2013.01); *H03F 3/72* (2013.01); *H03H 7/40* (2013.01); *H03J 5/246* (2013.01); *H04B 1/18* (2013.01); *H03F 2200/111* (2013.01); *H03F 2200/213* (2013.01); *H03F 2200/222* (2013.01); *H03F 2200/225* (2013.01); *H03F 2200/294* (2013.01); *H03F 2200/451* (2013.01); *H03F 2203/7209* (2013.01); *H03J 2200/10* (2013.01); *H03J 2200/15* (2013.01)

(58) Field of Classification Search
CPC ................................................. H03F 2200/222
USPC ................... 455/77, 84, 87; 343/860
See application file for complete search history.

(56) References Cited

U.S. PATENT DOCUMENTS

| 6,903,612 B2 | 6/2005 | Toncich et al. | |
| 7,023,272 B2 | 4/2006 | Hung et al. | |
| 7,495,515 B1 | 2/2009 | Branch et al. | |
| 7,622,989 B2 | 11/2009 | Tzeng et al. | |
| 2003/0015661 A1 | 1/2003 | Lee et al. | |
| 2003/0076194 A1* | 4/2003 | Machui | H04B 1/52 333/133 |
| 2003/0156661 A1 | 8/2003 | Nakamura | |
| 2007/0063788 A1 | 3/2007 | Zhu et al. | |
| 2009/0115525 A1* | 5/2009 | Yim | H03F 1/22 330/277 |
| 2011/0065472 A1 | 3/2011 | Zhu et al. | |
| 2011/0273355 A1* | 11/2011 | Ahn | H01Q 3/24 343/860 |

FOREIGN PATENT DOCUMENTS

| EP | 1526637 A1 | 4/2005 |
| WO | 2006047294 A1 | 5/2006 |

OTHER PUBLICATIONS

International Search Report and Written Opinion—PCT/US2014/060369—ISA/EPO—Jan. 22, 2015, 13 pages.

* cited by examiner

*Primary Examiner* — Hsin-Chun Liao
(74) *Attorney, Agent, or Firm* — Toler Law Group PC

(57) ABSTRACT

Exemplary embodiments are related to a low-noise amplifier (LNA) matching device. A device may include an antenna for receiving a wireless signal and at least one LNA. The device may further include an LNA matching device coupled between the antenna and the at least one LNA and configured to receive one or more control signals to provide an optimal LNA match setting for each band of a plurality of frequency bands.

21 Claims, 16 Drawing Sheets

LOW-NOISE AMPLIFIER MATCHING

BACKGROUND

1. Field

The present invention relates generally to low-noise amplifier matching devices.

2. Background

Multi-mode, multi-standard wireless communication devices usually require one or more high performance radio receivers, which should provide adequate signal-to-noise (SNR) performance for weak signals to achieve maximum sensitivity performance. Additionally, a multi-mode receiver should linearly handle signal and interference levels over a wide dynamic range with minimal distortion. That is, high linearity performance is needed. Distortion within a receiver may be caused by, for example, intermodulation and gain compression. Higher linearity results in reduced intermodulation levels and gain compression. Consequently, low noise, high gain performance is also needed. Typically, receiver design techniques, which simultaneously provide both high linearity and low noise, are difficult to achieve and are subject to design compromises.

One important constituent of a high performance receiver is a low-noise amplifier (LNA). An LNA may be a major determinant of the overall noise performance of the receiver. In other words, the characteristics of the LNA, such as high linearity and low noise, may dominate the overall receiver performance. Generally, an LNA is placed at the front-end of a receiver, near a receive antenna interface, to minimize radio frequency (RF) losses between an antenna and the LNA. The LNA is designed to provide high gain while contributing a minimal amount of excess noise beyond the noise appearing at an LNA input. This property is known as a low noise figure. To achieve a high linearity characteristic, the LNA should also have a high third-order input intercept point (IIP3), which is an input level where the third-order intermodulation product level equals the extrapolated linear desired output level. In general, a high value of IIP3 indicates high linearity performance.

Transceiver devices are shrinking in size while adding more LNAs to cover more frequency bands and more modes. Conventional RF transceiver application specific integrated circuits (ASICs) may include at least 20 LNAs to cover low bands (600 MHz to 960 MHz), middle bands (1400 to 2100 MHz) and high bands (2200 MHz to 2700 MHz). Device packages including at least 20 LNAs may be around 3.8 millimeters by 3.8 millimeters, yet the passive matching components for each LNA occupy area three times the size of a transceiver device. Moreover, each LNA must be manually impedance matched for best noise figure and gain, thus, consuming additional time. Accordingly, receiver LNA matching takes up a large amount of area, and requires significant effort to change each part. A typical LNA may have two passive matching components and, assuming 20 primary receiver LNAs and 20 diversity receiver LNAs, a receiver can include around 80 passive matching components.

A need exists for an enhanced wireless communication device. More specifically, a need exists for embodiments related to a wireless communication device including a programmable LNA matching device.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Conventional transceivers of wireless communication devices are designed for global band and mode coverage, and may exceed 20 frequency bands in a single mobile handset. Further, as illustrated below in FIGS. 1 and 2, conventional transceivers may require a multitude of LNAs with band select filters for each receive signal path. A transceiver may include a switch that selects each receive signal path with the appropriate filters, LNA match, and accompanying LNA for the selected receiver paths. Further, transceivers may use an antenna switch module (ASM) followed by one or more filters, and, in many cases another switch depending on the number of LNAs or carrier aggregation. Each LNA within the transceiver may include two or three passive matching components, and passive matching component area may exceed transceiver ASIC area by several orders of magnitude. Despite receiver and LNA simulation that predicts starting LNA match values, manual empirical matching is still needed due to printed circuit board (PCB) parasitic and non-ideal passive components. Further, more LNA passive components equate to significantly more time devoted to matching.

Figure 1:
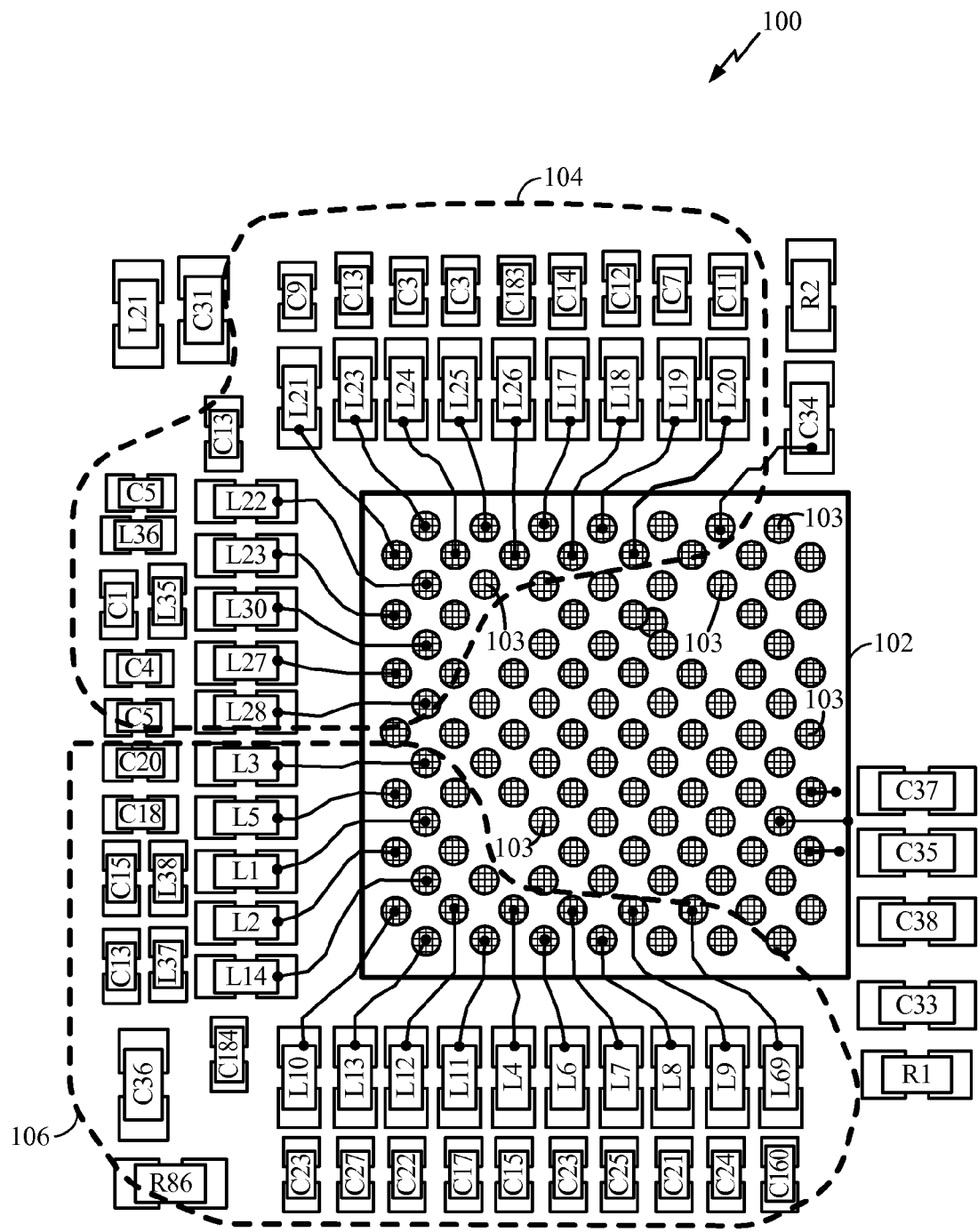
FIG. 1 illustrates a device including a transceiver application specific integrated circuit, in accordance with an exemplary embodiment of the present invention.

FIG. 1 illustrates a device 100 including a transceiver ASIC 102 including LNAs 103. Device 100 further includes primary receiver LNA matching circuitry 104 and diversity receiver LNA matching circuitry 106. As illustrated in FIG. 1, each LNA 103 is coupled to dedicated matching components, which results in increased matching component area.

Figure 2:
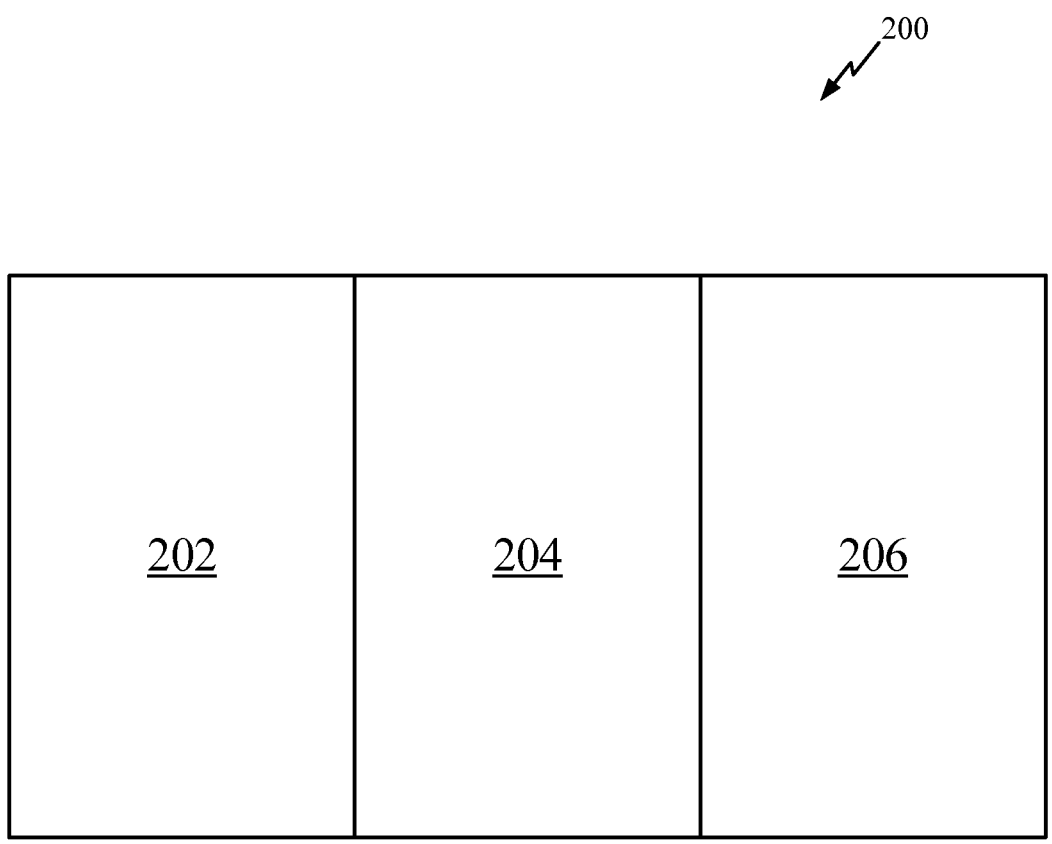
FIG. 2 depicts a wireless communication device.
Figure 2A:
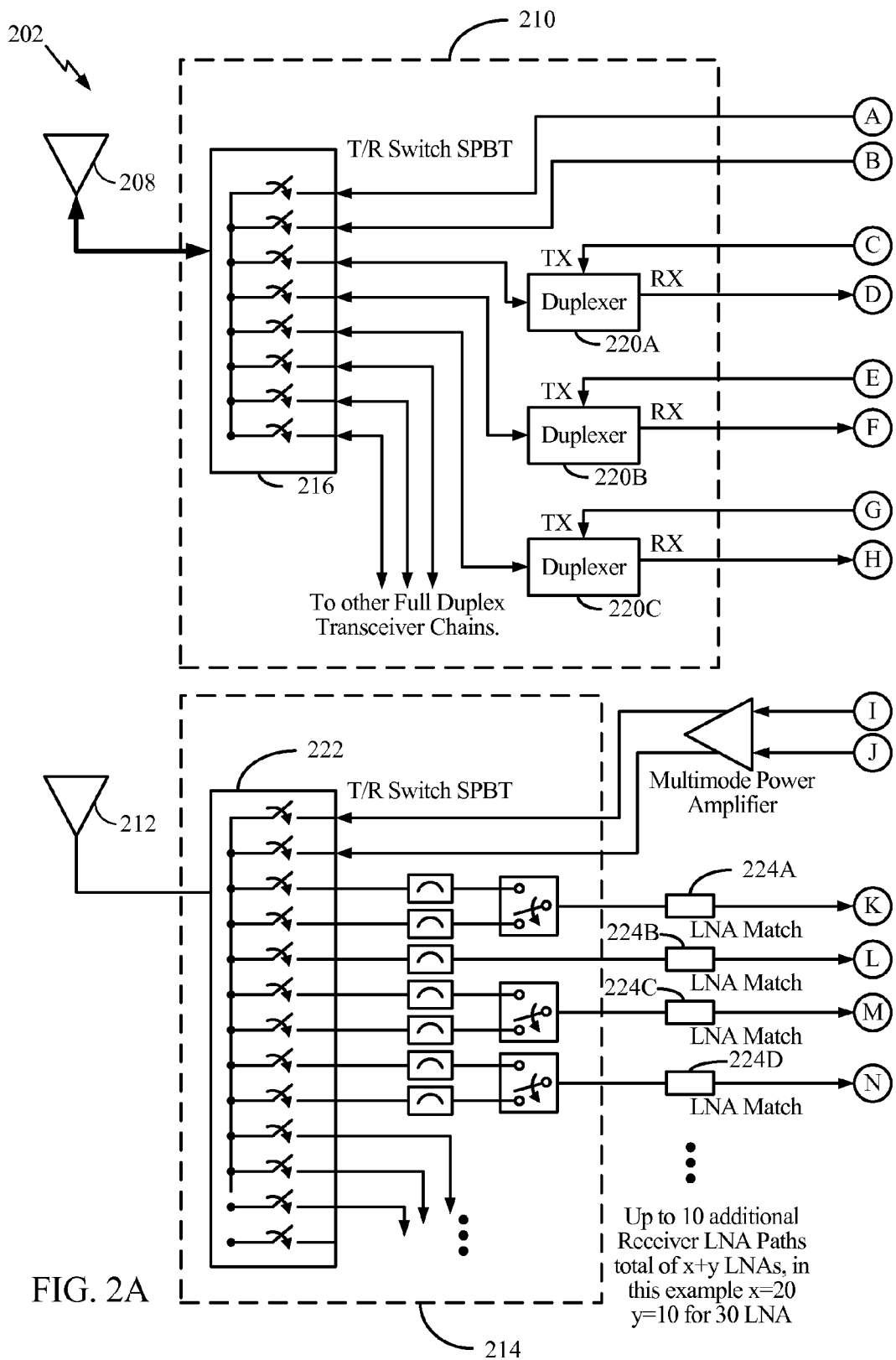
FIGS. 2A-2C illustrate individual portions of the wireless communication device of FIG. 2.
Figure 2B:
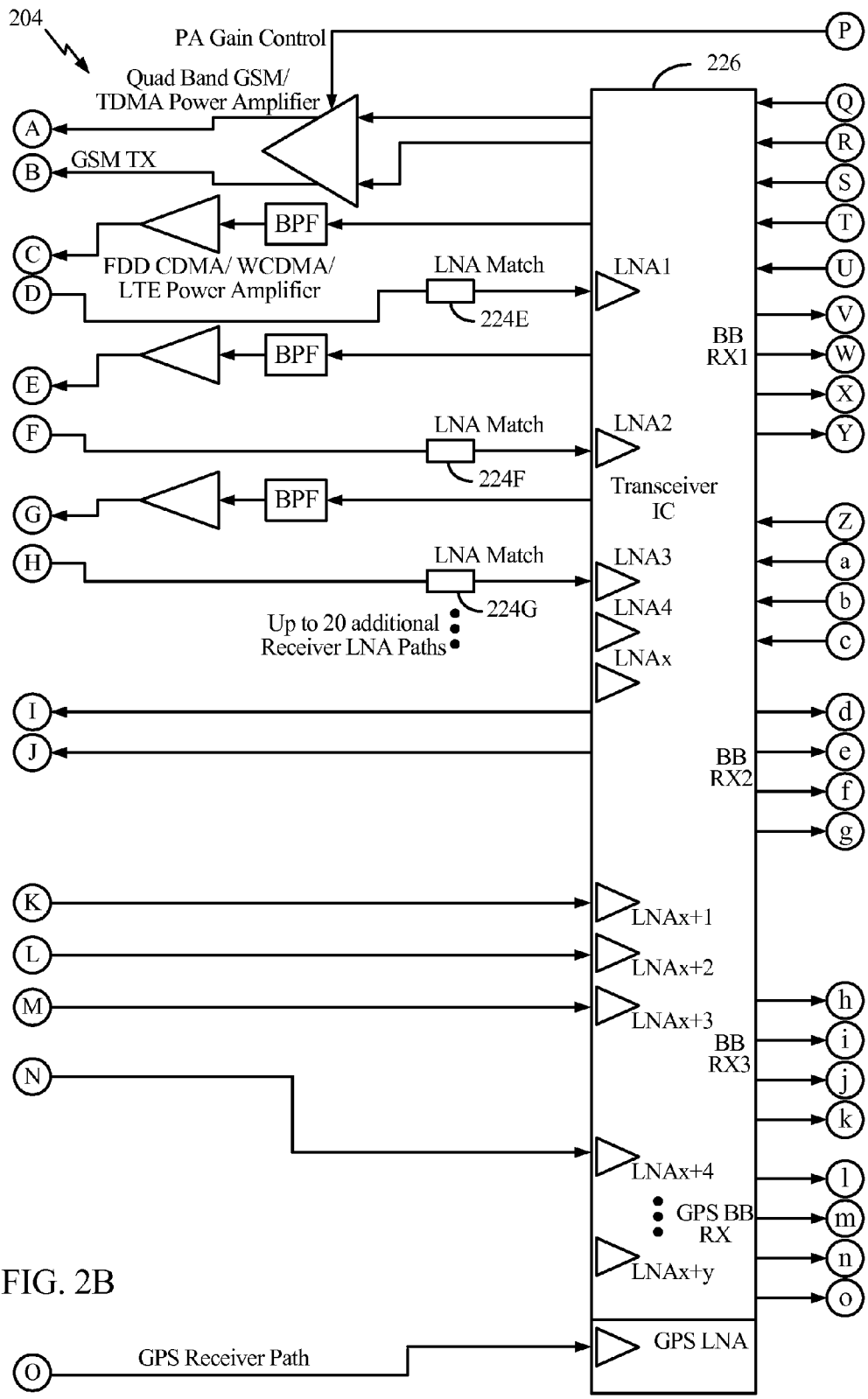
Figure 2C:
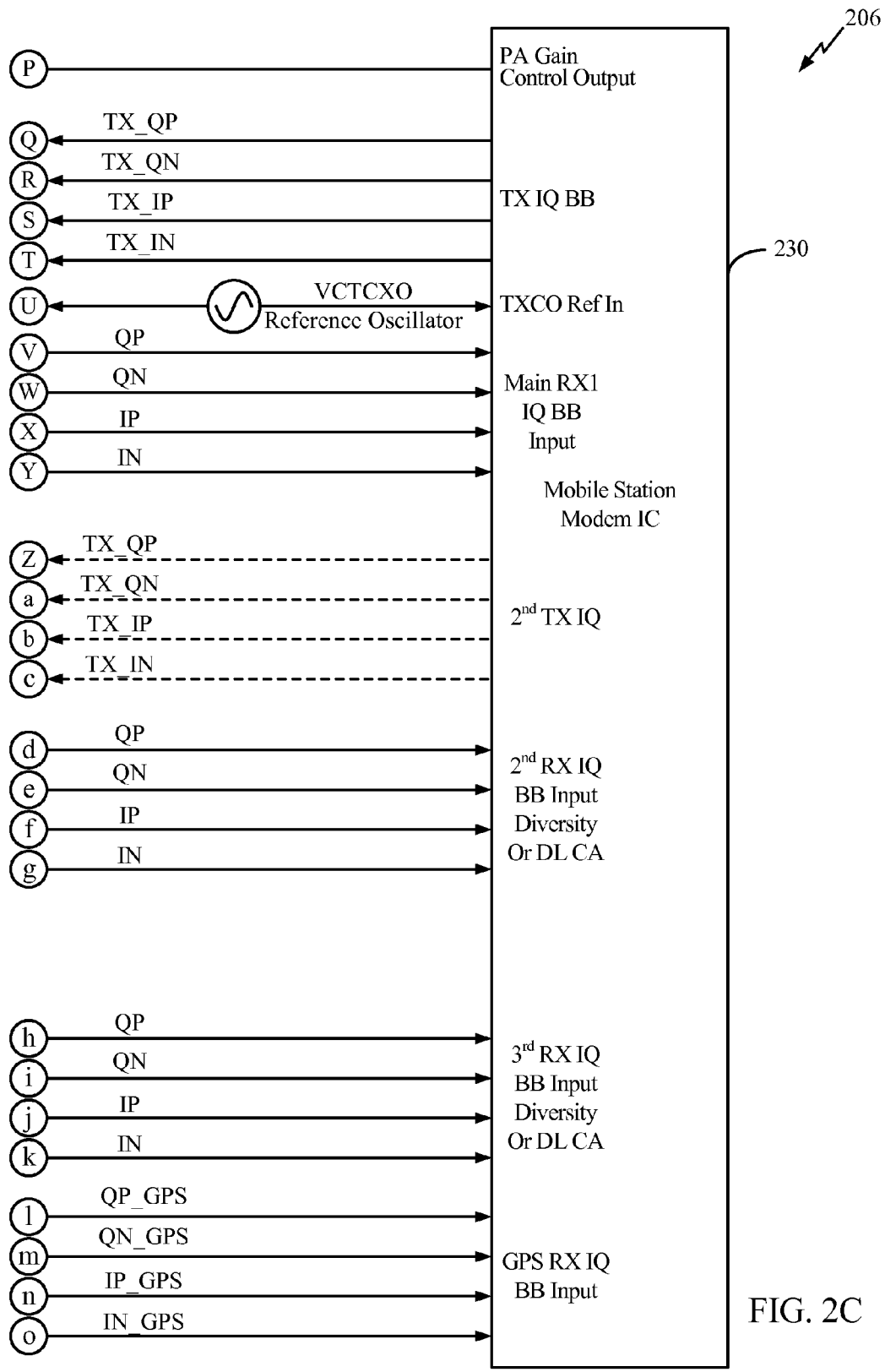

FIG. 2 illustrates a wireless communication device 200 including a portion 202 illustrated in detail in FIG. 2A, a portion 204 illustrated in detail in FIG. 2B, and a portion 206 illustrated in detail in FIG. 2C. With reference to FIG. 2A, communication device 200 includes a primary antenna 208 coupled to a first antenna module 210 and a diversity antenna 212 coupled to a second antenna module 214. First antenna module 210 includes a switch 216 coupled to duplexers 220A-220C. Further, second antenna module 214 includes a switch 222 coupled to a plurality of LNA paths including LNA matching circuits 224A-224D associated with second antenna module 214 and diversity antenna 212. It is noted that device 200 may include additional LNA receive paths (e.g., 20-30 LNA receive paths) associated with second antenna module 214 and diversity antenna 212.

With reference to portion 204 illustrated in FIG. 2B, device 200 further includes additional LNA matching circuits 224E-224G within LNA receive paths associated with first antenna module 210 and primary antenna 208. It is noted that device 200 may include additional LNA receive paths (e.g., 20 LNA receive paths) associated with first antenna module 210 and primary antenna 208. With continued reference to portion 204, device 200 also includes a transceiver integrated circuit (IC) 226 including a plurality of LNAs, wherein each LNA is associated with a dedicated LNA path. With reference to portion 206 illustrated in FIG. 2C, device 200 may also include a mobile station modem ID 230 coupled to transceiver IC 226 (see FIG. 2B). As will be appreciated by a person having ordinary skill in the art, device 200, which comprises a conventional transceiver, requires a multitude of LNAs with band select filters for each receive signal path.

Exemplary embodiments, as described herein, are directed to devices and methods related to programmable LNA matching. In accordance with various exemplary embodiments of the present invention, a programmable matching device, which allows for automated receiver noise matching for minimum receiver noise figure, may greatly reduce a significant number of LNA matching components within a wireless communication device. The programmable LNA matching device may include one or more built-in broad-band switches to multiplex LNA inputs from many band select filters including duplexers. Accordingly, one broad-band LNA, or a small number of LNAs, can service a large number of frequency bands such that a processor, using a settings lookup table, can set an optimum LNA match setting for each band. The programmable LNA may require one or more external inductors for various embodiments in order to realize higher Q. Other embodiments including glass or sapphire substrates could employ in package high Q inductors for a completely integrated solution. Further, embodiments may include integrated passive devices on glass along with a device die for a highly compact software controlled tunable device. Additionally, embodiments could integrate programmable LNA matching into a transceiver ASIC eliminating most LNA matching.

More specifically, according to one exemplary embodiment, a device may include at least one LNA and an LNA matching device coupled to the at least one LNA and configured to receive one or more control signals to provide an optimal LNA match setting for a selected band of a plurality of frequency bands. Another exemplary embodiment of the present invention includes methods for operating an LNA matching device. Various embodiments of such a method may include receiving a wireless signal at an LNA matching device and conveying the wireless signal from the LNA matching device to an LNA. The method may also include measuring a noise figure of the wireless signal and tuning the LNA matching device to minimize the noise figure for a selected band of a plurality of frequency bands.

Other aspects, as well as features and advantages of various aspects, of the present invention will become apparent to those of skill in the art through consideration of the ensuing description, the accompanying drawings and the appended claims.

Figure 3:
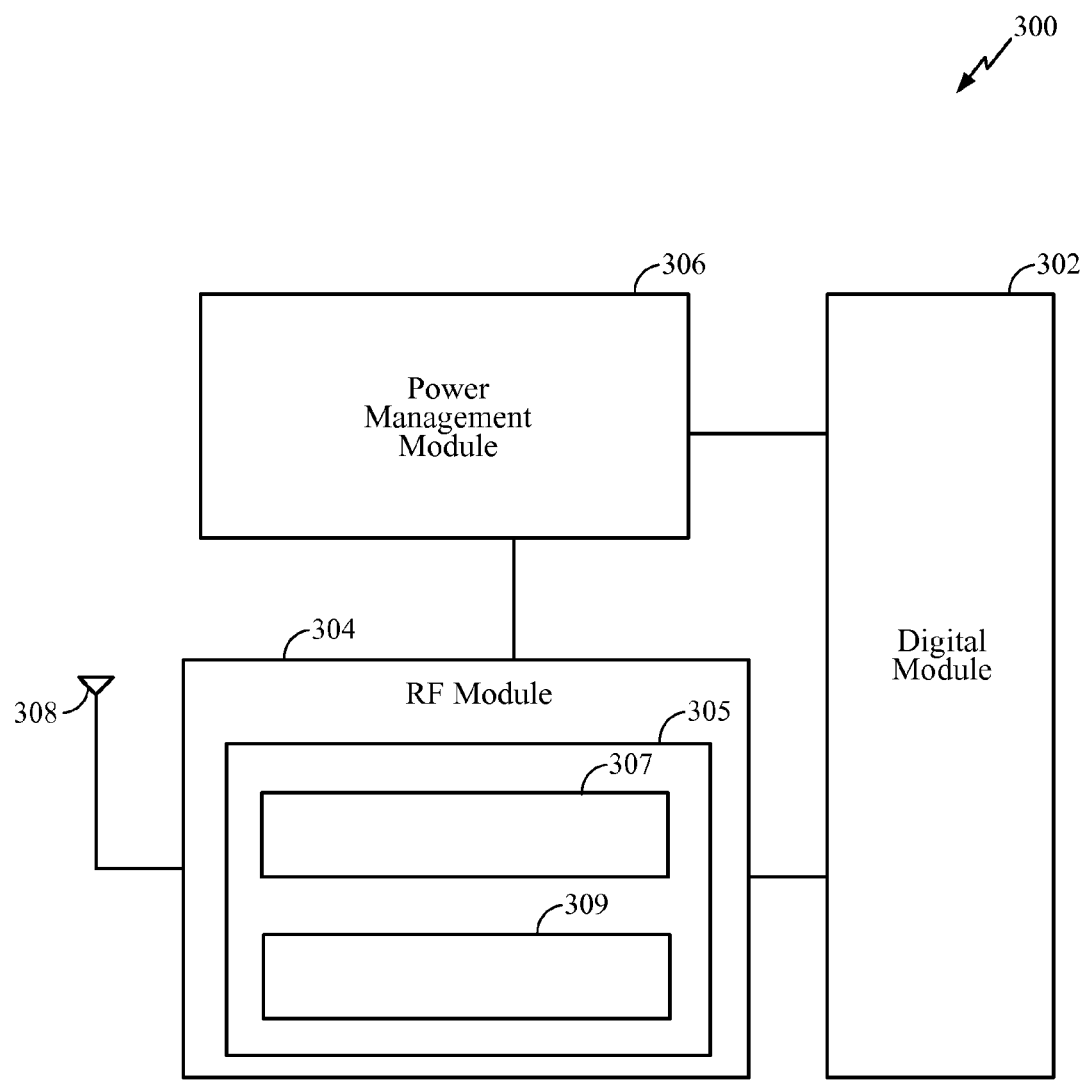
FIG. 3 is a block diagram of an electronic device, according to an exemplary embodiment of the present invention.

FIG. 3 is a block diagram of an electronic device 300, according to an exemplary embodiment of the present invention. According to one example, device 300 may comprise a portable electronic device, such as a mobile telephone. Device 300 may include various modules, such as a digital module 302, an RF module 304, and a power management module 306. Digital module 302 may comprise memory and one or more processors. RF module 304, which may comprise RF circuitry, may include a transceiver 305 including a transmitter 307 and a receiver 309 and may be configured for bi-directional wireless communication via an antenna 308. In general, wireless communication device 300 may include any number of transmitters and any number of receivers for any number of communication systems, any number of frequency bands, and any number of antennas. According to an exemplary embodiment of the present invention, receiver 309 may include one or more of the exemplary embodiments described below.

Figure 4:
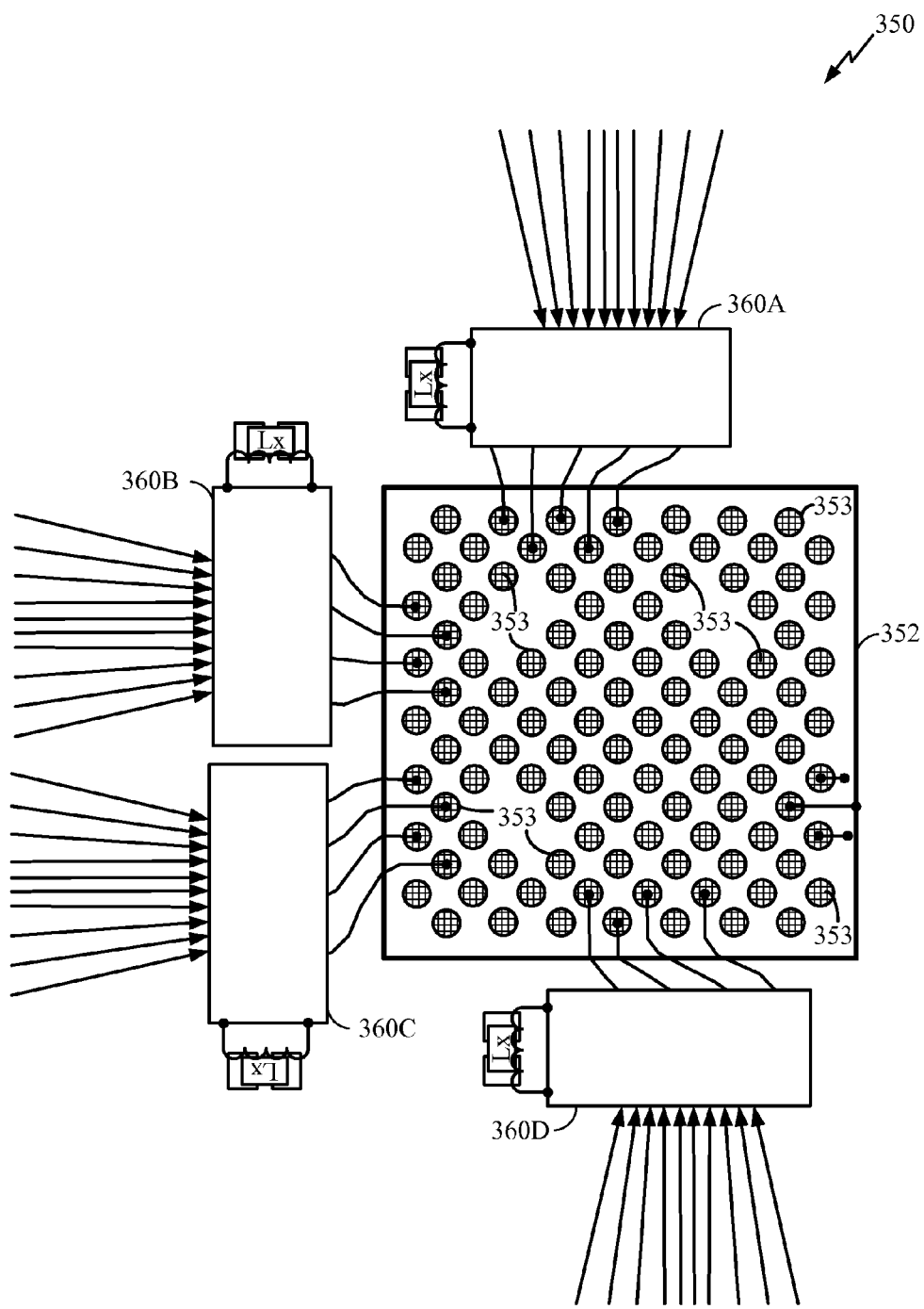
FIG. 4 illustrates a device including a transceiver module coupled to a plurality of matching devices, in accordance with an exemplary embodiment of the present invention.

FIG. 4 illustrates a device 350, in accordance with an exemplary embodiment of the present invention. Device 350 includes a transceiver module 352 (e.g., a transceiver ASIC) having a plurality of LNA inputs 353. Further, device 350 includes devices 360A-360D, each of which may be referred to herein as a programmable LNA matching device. Each device 360A-360D is configured to receive a plurality of inputs from, for example, a duplexer (not shown in FIG. 4) and convey an output, which may be received by one of a plurality of LNAs of transceiver module 352. As illustrated, each device 360A-360D may have an external inductor Lx coupled thereto. By way of example, device 360A may be configured to receive primary low band (LB) (e.g., 600 MHz to 960 MHz) and/or mid band (MB) (e.g., 1400 to 2100 MHz) inputs from one or more duplexer filter banks, and device 360B may be configured to receive primary high-band (HB) (e.g., 2200 MHz to 2700 MHz) inputs from one or more duplexer filter banks. Further, device 360C may be configured to receive diversity HB inputs from one or more duplexer filter banks, and device 360D may be configured to receive diversity LB and/or MB inputs from one or more duplexer filter banks. As an example, each device 360A-360D may include between four and ten inputs and four outputs.

Figure 5:
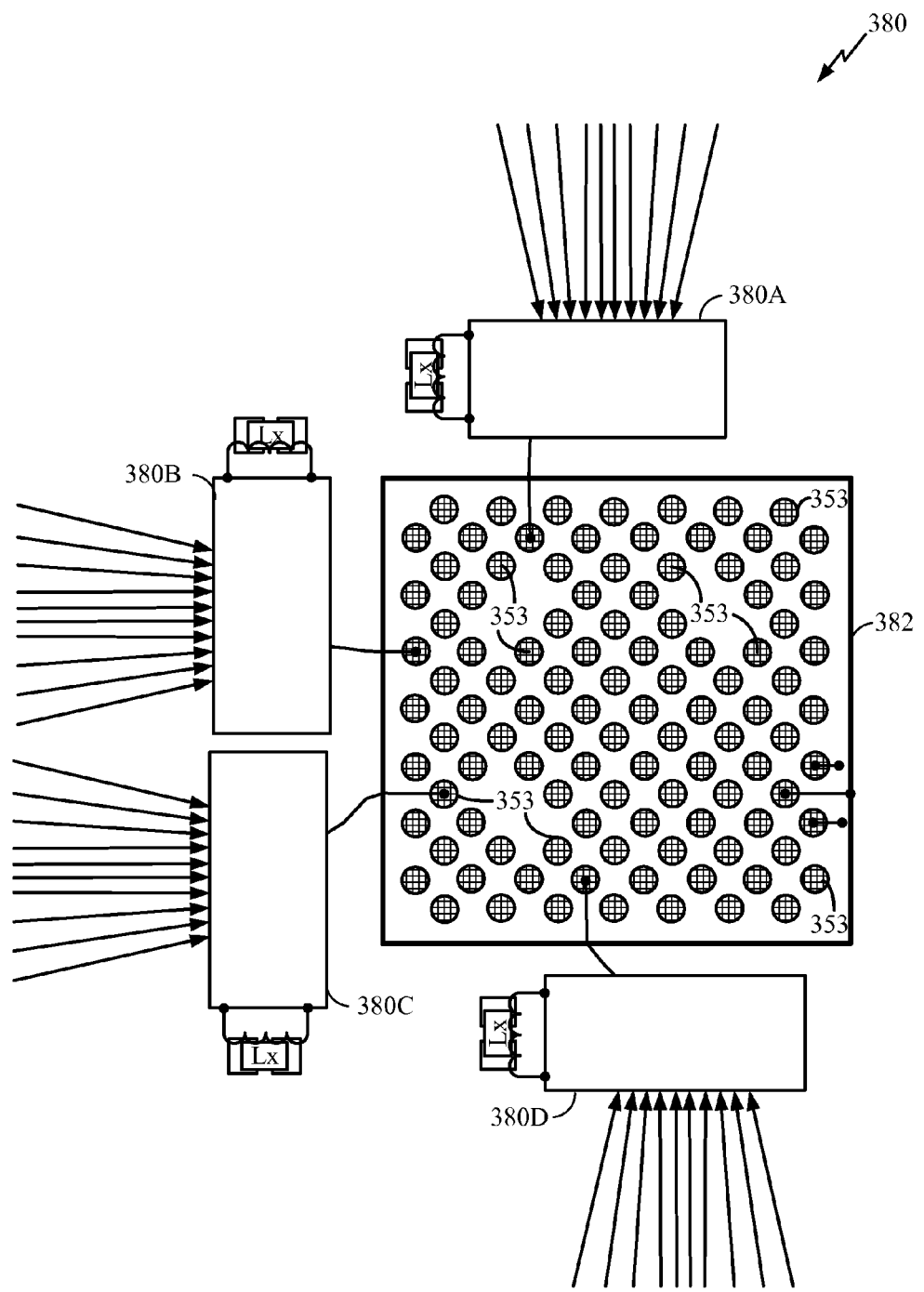
FIG. 5 illustrates another device including a transceiver module coupled to a plurality of matching devices, according to an exemplary embodiment of the present invention.

FIG. 5 illustrates another device 380, according to an exemplary embodiment of the present invention. Device 380 includes a transceiver module 382 (e.g., transceiver ASIC) having a plurality of LNA inputs 353. Further, device 380 includes devices 380A-380D, each of which may also be referred to herein as a programmable LNA matching device. Each device 380A-380D is configured to receive a plurality of inputs from, for example, a duplexer (not shown in FIG. 5) and convey an output, which may be received by an LNA of transceiver module 382. As illustrated, each device 380A-380D may have an external inductor Lx coupled thereto. By way of example, device 380A may be configured to receive primary LB and/or mid band MB inputs from one or more duplexer filter banks, and device 380B may be configured to receive primary HB inputs from one or more duplexer filter banks. Further, device 380C may be configured to receive diversity HB inputs from one or more duplexer filter banks, and device 380D may be configured to receive diversity LB and/or MB inputs from one or more duplexer filter banks.

As an example, each device 380A-380D may include between two and ten inputs depending on number of bands or target area savings affected by package size. Further, each device 380A-380D may include, for example, one output. As will be described in more detail below, an LNA matching device may function according to an automated matching algorithm for providing optimal matching for a selected LNA. It is noted that an input multiplexer switch, device die, and passive devices including external inductor Lx may be integrated on a glass or sapphire substrate for a highly integrated compact device solution.

Further, according to other embodiments, one or more LNAs may be integrated into device 380 with only one output.

Figure 6:
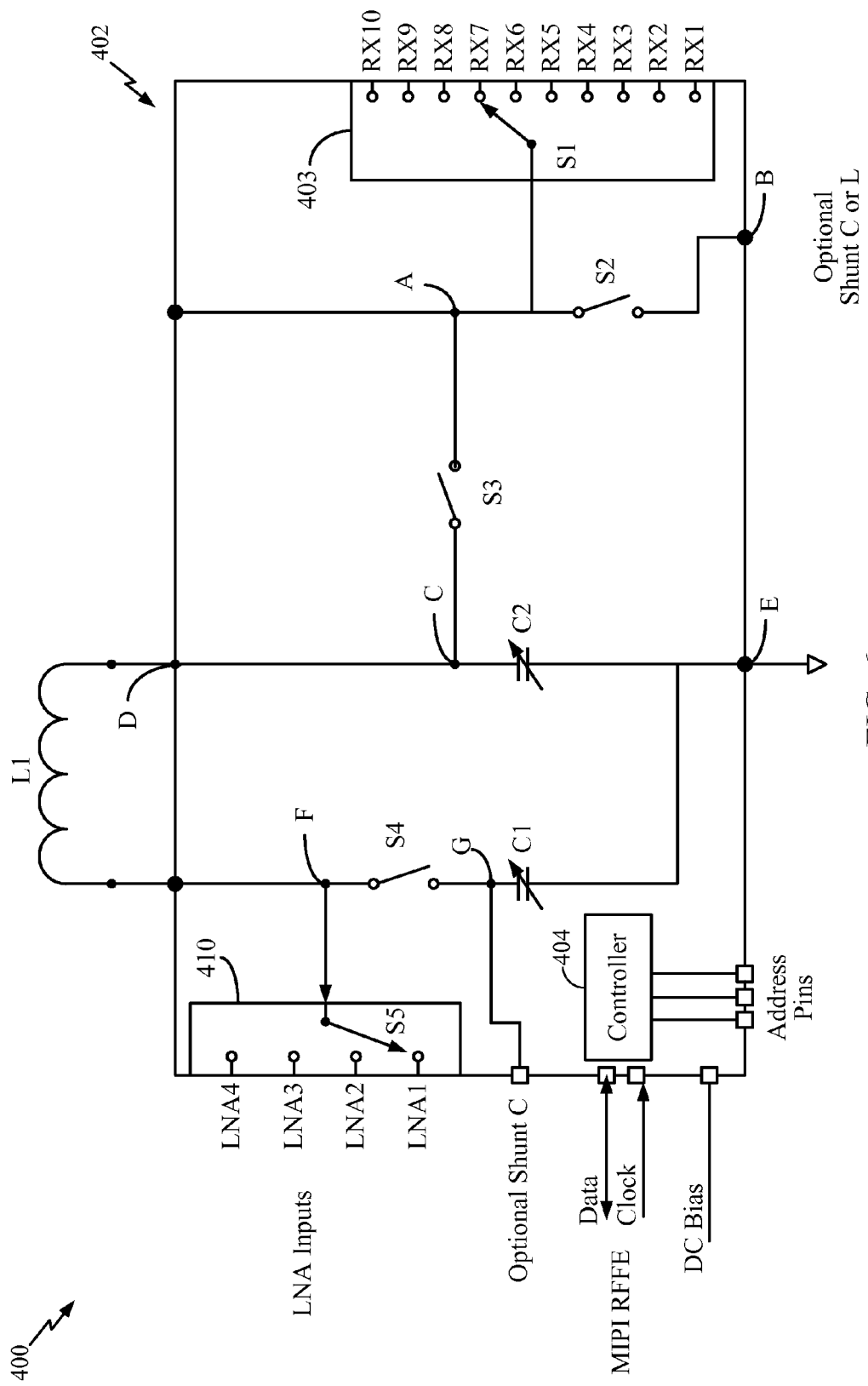
FIG. 6 illustrates a matching device, according to an exemplary embodiment of the present invention.

FIG. 6 illustrates a device 400, according to an exemplary embodiment of the present invention. Device 400 includes an LNA matching device 402, which includes an input unit 403 including a switch S1 for selectively coupling to one of a plurality of receive paths RX1-RX10. Although switch S1 is illustrated as being configured for selectively coupling to one of ten possible receive paths, the present invention is not so limited. Rather, switch Si may be configured for selectively coupling to one of any number of receive paths. LNA matching device 402 further includes switches S2-S4 and variable capacitors C1 and C2. By way of example, variable capacitors C1 and C2 may comprise digitally stepped capacitors banks, analog tuned capacitors, or a combination thereof As illustrated, switch S2 is coupled between a node A and a node B. Node B may be further coupled to a shunt capacitor or a shunt inductor, if needed. A determination as to whether a shunt capacitor or shunt inductor should be coupled to node B may be based on the LNA optimum source impedance for best noise figure. Further, switch S3 is coupled between node A and a node C, which is also coupled to a node D. Variable capacitor C2 is coupled between node C and a node E, which may be further coupled to a ground voltage. Variable capacitor C1 is coupled between node E and a node G, which may be further coupled to a shunt capacitor, if needed. Further, switch S4 is coupled between node G and a node F. Node F is further coupled to an output unit 410, which includes a switch S5 for selectively coupling to one of a plurality of LNA inputs (i.e., LNA inputs LNA1-LNA4).

Device 400 further includes an inductor L1, which is external to LNA matching device 402 and is coupled between nodes F and D. In addition, LNA matching device 402 may include a controller 404, which may be configured for interfacing with another, external controller and for controlling operation of switches S1-S5 and variable capacitors C1 and C2.

According to one exemplary embodiment, controller 404 may select configurations of switches S5 and S1 depending on a band of operation. Further, controller 404 may configure switches S3, S4, and S2 as needed to allow the selection of values for capacitors C1 and C2 combined with inductor L1 and the optional Shunt C or L, if needed. If an LNA is designed for optimum noise figure near the characteristic impedance of a receiver (usually 50 ohms in most radio systems), then the topology of the exemplary embodiment shown in FIG. 6 is sufficient. Depending on the location of the LNA minimum noise figure (e.g., on a Smith Chart), the source impedance is transformed such that an optimization algorithm may select values closest to the best noise figure location. It is noted that parasitics introduced by switch S5 may be compensated by the design of device 400 with the proper selection of a value of inductor L1, and capacitor ranges for capacitors C1 and C2.

Figure 7:
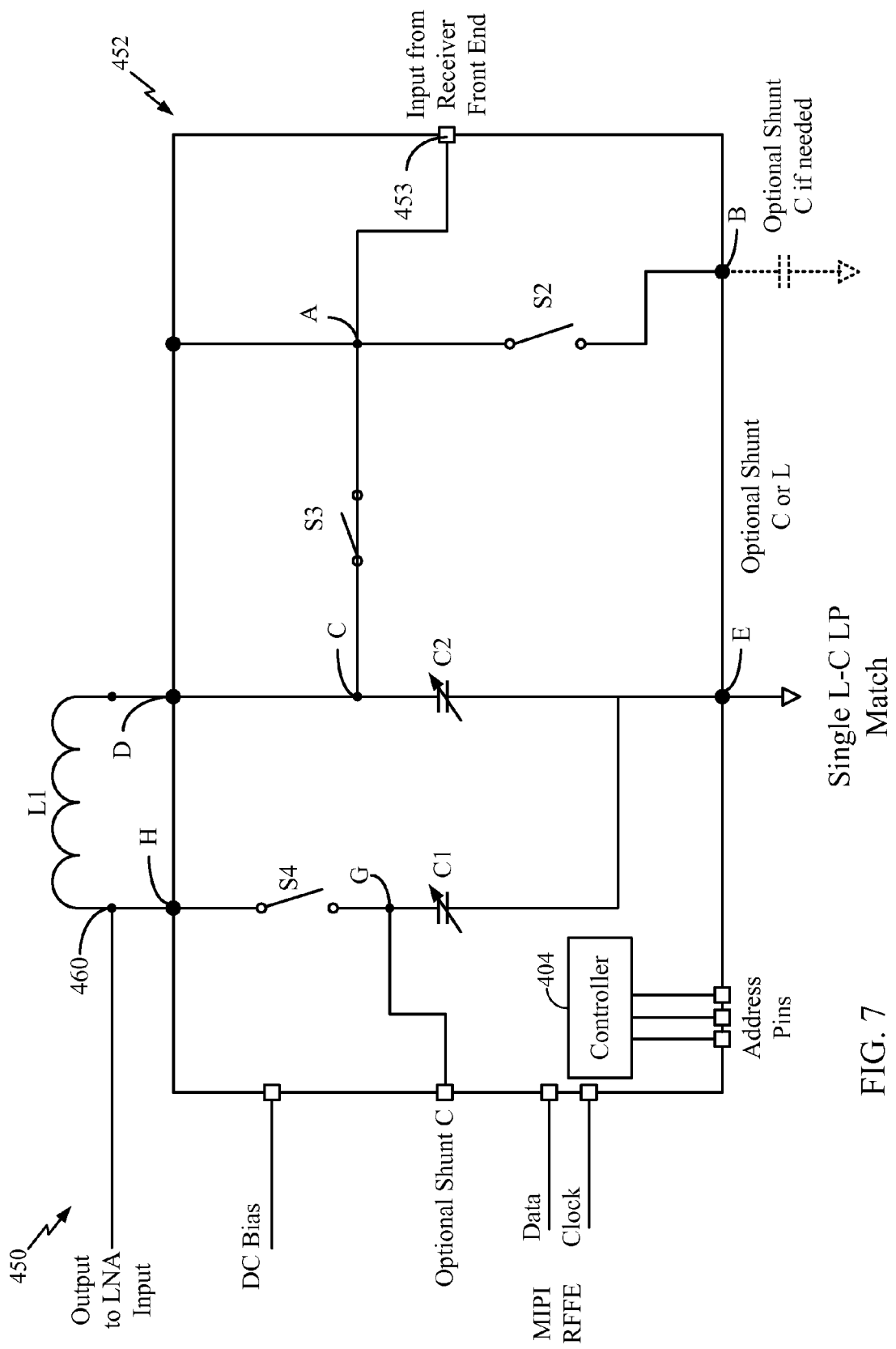
FIG. 7 illustrates another matching device, in accordance with an exemplary embodiment of the present invention.

FIG. 7 illustrates a device 450, according to another exemplary embodiment of the present invention. Device 450 includes an LNA matching device 452 including an input 453 coupled to a receive path. LNA matching device 452 further includes switches S2-S4 and variable capacitors C1 and C2. Similar to LNA matching device 402 (see FIG. 6), switch S2 is coupled between node A and node B. Node B may be further coupled to a shunt capacitor or a shunt inductor, if needed. Further, switch S3 is coupled between node A and node C, which is also coupled to node D. Variable capacitor C2 is coupled between node C and node E, which may be further coupled to a ground voltage. Variable capacitor C1 is coupled between node E and node G, which may be further coupled to a shunt capacitor, if needed. Further, switch S4 is coupled between node G and a node H. Node H is further coupled to an output 460, which may be coupled to an input of an LNA.

Device 450 further includes inductor L1, which is external to LNA matching device 452 and coupled between nodes H and D. In addition, LNA matching device 452 may include controller 404, which may be configured for interfacing with another, external controller and for controlling operation of switches S2-S4 and variable capacitors C1 and C2. Unlike device 400 of FIG. 6, device 450 does not include multiplex switches and, therefore, does not include the associated insertion losses plus parasitic. The operation of device 450 may be the same as device 400 wherein node B could have an optional shunt C or shunt L depending on where the LNA optimum impedance is needed for best gain and noise figure.

Figure 8:
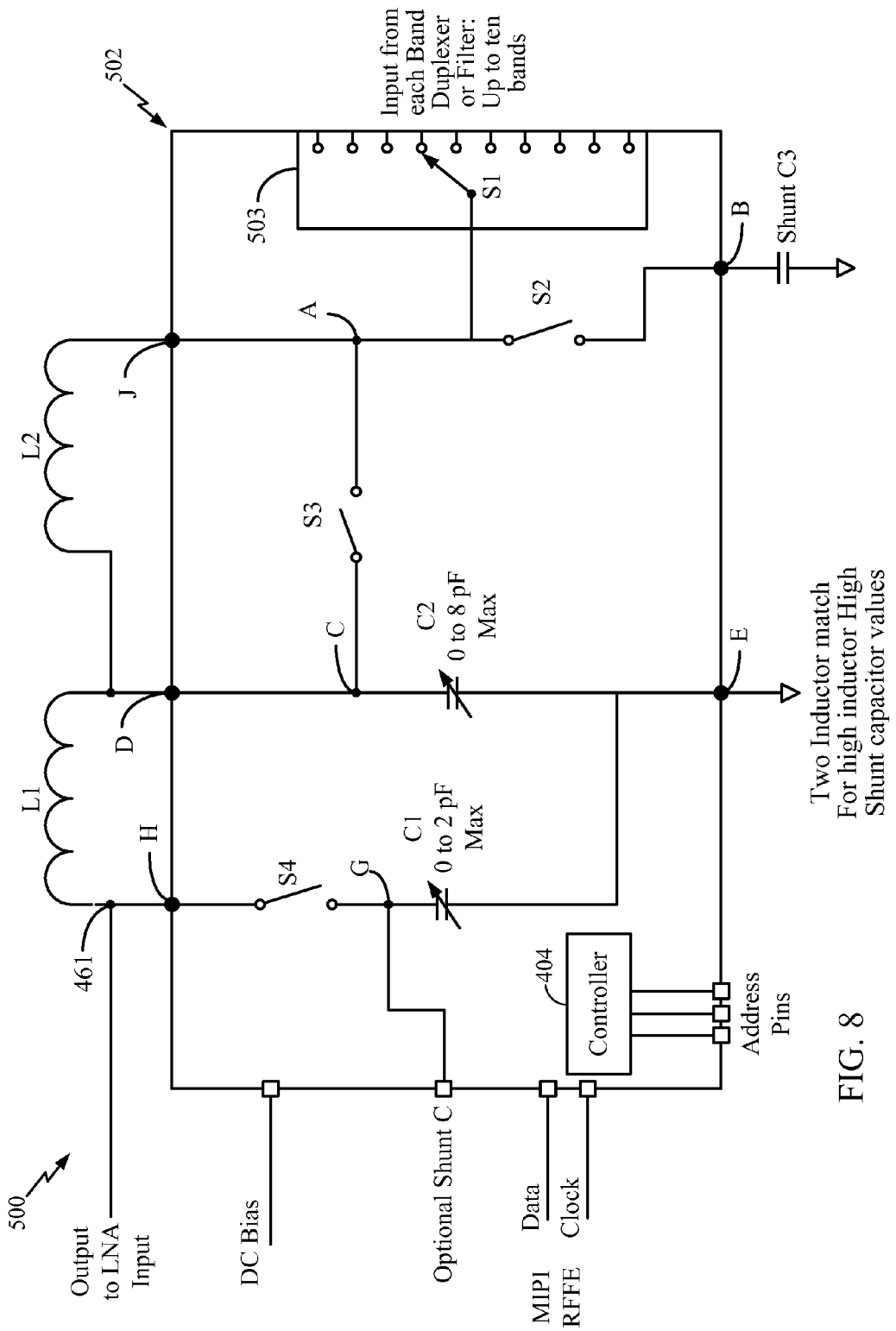
FIG. 8 illustrates yet another matching device, according to an exemplary embodiment of the present invention.

FIG. 8 illustrates a device 500, according to an exemplary embodiment of the present invention. Device 500 includes an LNA matching device 502, which includes an input unit 503 including switch Si for selectively coupling to one of a plurality of low frequency inputs from, for example, a front end duplexer bank. Although switch S1 is illustrated as being configured for selectively coupling to one of ten receive paths, the present invention is not so limited. Rather, switch Si may be configured for selectively coupling to one of any number of receive paths. LNA matching device 502 further includes switches S2-S4 and variable capacitors C1 and C2. Similar to LNA matching device 402 (see FIG. 6), switch S2 is coupled between node A and node B, which may be further coupled to a shunt capacitor or a shunt inductor, if needed. Further, switch S3 is coupled between node A and node C, which is also coupled to node D. Variable capacitor C2 is coupled between node C and node E, which may be further coupled to a ground voltage. Variable capacitor C1 is coupled between node E and node G, which may be further coupled to a shunt capacitor, if needed. Further, switch S4 is coupled between node G and node H. Node H is further coupled to an output 461, which may be coupled to an input of an LNA.

As will be appreciated by a person having ordinary skill in the art, radio frequencies below 800 MHz may require physically larger, higher value matching inductors that have a high Q. Further, to save board area, two series connected small high Q inductors may be used instead of a physically large high Q inductor. Accordingly, as illustrated in FIG. 8, device 500 further includes inductor L1, which is external to LNA matching device 502 and coupled between nodes H and D. An additional inductor L2, which is also external to LNA matching device 502, is coupled between node D and a node J.

LNA matching device 502 may further include controller 404, which may be configured for interfacing with another, external controller and for controlling operation of switches S1-S4 and variable capacitors C1 and C2. The operation of device 500 may be the same as device 400 except device 500 does not include switch S5, and switch S3 is open, causing the signal to pass through inductor L2. Device 500 may use a shunt capacitor C3 with inductor L2, capacitor C2, inductor L1 and perhaps capacitor C1 to match a low frequency LNA.

Various receiver components, such as transceiver module 382 and LNA inputs 353 (see FIG. 5), can employ a wideband LNA using exemplary embodiments of the invention as a programmable LNA match that can be re-adjusted depending on the frequency band selected via switch S1 in device 500. Further, device 500 can be used for any band segmentation where low bands may need two series inductors, while the middle bands (typically 1400 MHz to 2100 MHz) may need only one inductor, and high bands (typically 2200 MHz to 2700 MHz or higher) may need only one inductor of a different value. The plurality of LNA inputs and associated matching components of a device (e.g., device 380 illustrated in FIG. 5) may be reduced to, for example, four packaged parts and four inductors by implementing device 500, thus resulting in area savings, decreased time for manual passive component matching, and software reconfigurable matching. Further, device 500 may enable easy modification of a front-end design for new or different frequency bands without manually re-matching the LNA. Moreover, a software lookup table, for example, can re-select values for capacitors C1, C2, and C3 for a new band, saving time and money, and supporting multiple products for multiple market areas.

As will be appreciated by a person skilled in the art, a transceiver front-end, which may include a transmit-receive antenna radio-frequency switch and duplexer filters for the bands of interest, may be designed for carrying out various embodiments of the present invention. By printed circuit board design, component selection, and simulation, a person skilled in the art may determine the source impedance (Zs) across the band of interest, for example, as seen from input 453 of device 450 illustrated in FIG. 7. Additionally, the impedance required by the LNA for best noise figure and gain at a specific frequency within each frequency band of interest may be predicted via simulation or other test. Further, knowledge of the LNA noise figure and gain circles may be helpful but are not always necessary. Note that it may be difficult to have best noise figure and best gain at the same time across the frequency band. In addition to the source impedance, a locus of points where the best noise figure is predicted and an operating range may be determined Therefore, a value of inductor L1 may be selected such that the capacitor values of C1 and C2 may cover the locus of points for best noise figure and cover a range of gain (gain circles), such that the source impedance enables the LNA to operate at the best combination of noise figure and gain for the best system output SNR.

Figure 9:
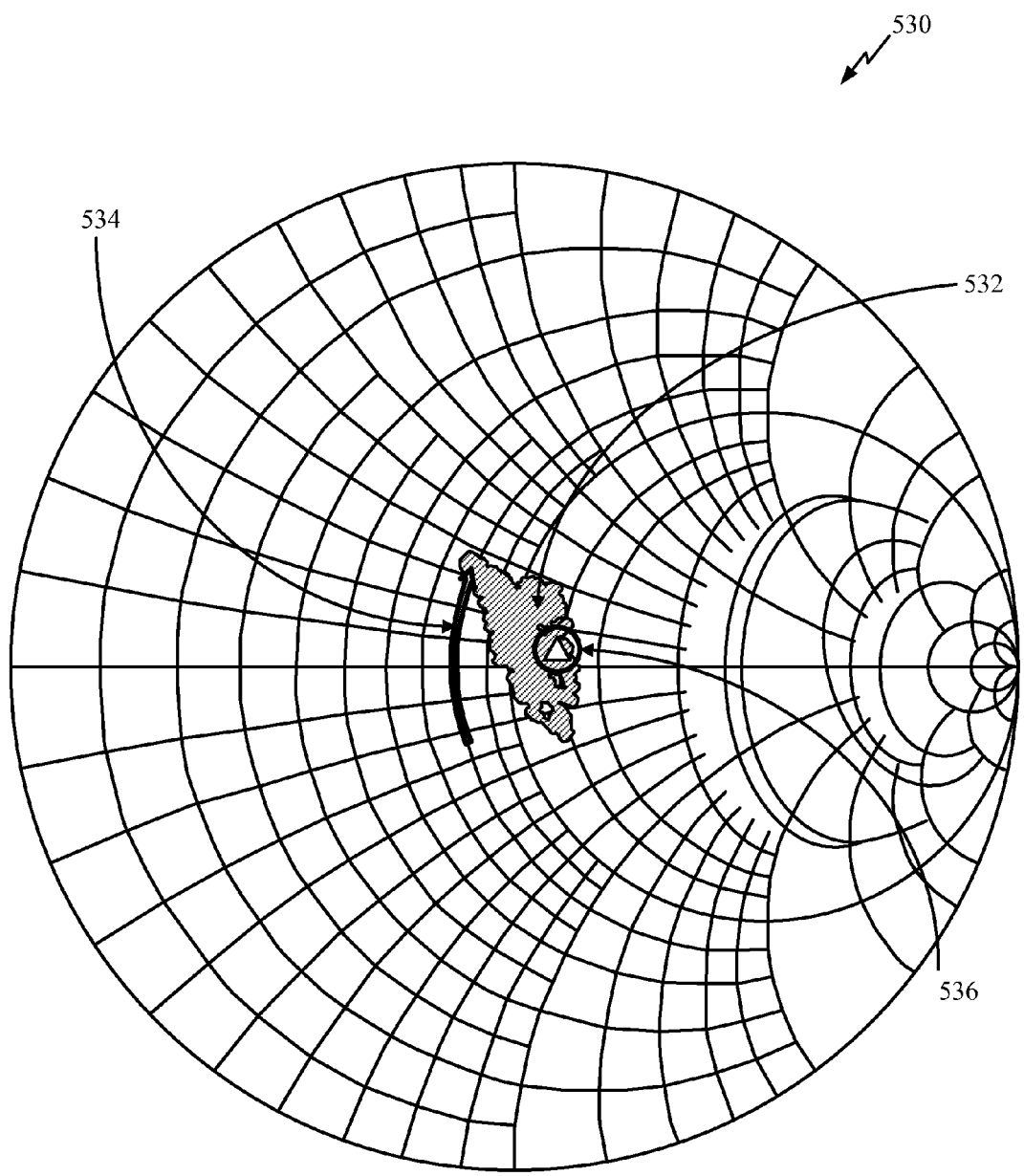
FIG. 9 is a Smith Chart illustrating an example selection of an inductor value.

FIG. 9 depicts a Smith Chart illustrating an example for selecting an inductor value for an LNA matching device. In this example, an inductor value for inductor L1 of device 450 (see FIG. 7) is selected wherein switch S2 is open, switch S3 is closed, and node B is not coupled to a shunt capacitor or a shunt inductor. Further, a source impedance is equal to 40-j12 ohms at 890 Mhz within an 860 MHz to 960 MHz range (e.g., B5 and B8 down link). As will be understood by a person having ordinary skill in the art, the optimal LNA noise figure may be Zopt=63+j8 Ohms; however, the optimal gain may be slightly off from this and may change across the band. The value of inductor L1 is selected such that the range of capacitors C1 and C2 produces a locus of points around Zopt as an optimization algorithm (e.g., optimization algorithm 630 of FIG. 11) searches for the optimal values of C1 and C2 which gives the best combination of system gain and cascaded noise figure. It is noted that the optimization algorithm may not know anything about the impedance and it may select the values for capacitors C1 and C2 and optimize based on the measured noise figure or output SNR. By the Friis' formula, the LNA noise factor and gain dominates the system cascaded noise factor. In the diagram below, L1 is a fixed value while C1 and C2 are randomly varied in value. Note that this example assumes the device parasitic shunt capacitance is included in capacitors C1 and C2. With specific reference to FIG. 9, reference numeral 532 represents a range of values of capacitor C1 and C2 steps with a selected value of inductor L1 over the frequency band of interest. Further, reference numeral 534 represents a selection of a fixed value of inductor L1 to allow the range of values for capacitor C1 and C2 to cover a locus of points 536 for an optimal impedance (e.g., the best system output SNR).

A person skilled in the art selects a fixed inductor L1 for the frequency band of interest such that the device along with the matching optimization algorithm can select the optimum values of C1 and C2 such that the system output SNR is maximum when measured with a continuous wave reference tone. This reference tone can be an external signal generator set for a known input SNR for a more precise measurement of system noise figure (NF) (with an optimum NF target or output SNR target the optimization algorithm will converge on settings for C1 and C2 quickly), or it can be an internal reference tone level set with some uncertainty so the system optimizes for best case output SNR. Proper selection of L1 with any of the exemplary embodiments match optimization over a wide operating bandwidth which might not be possible without manually changing passive components or using external RF switches with passive components. Finally, some designs may not need a series inductance. A short transmission line connection in place of L1 may be all that is needed.

Figure 10:
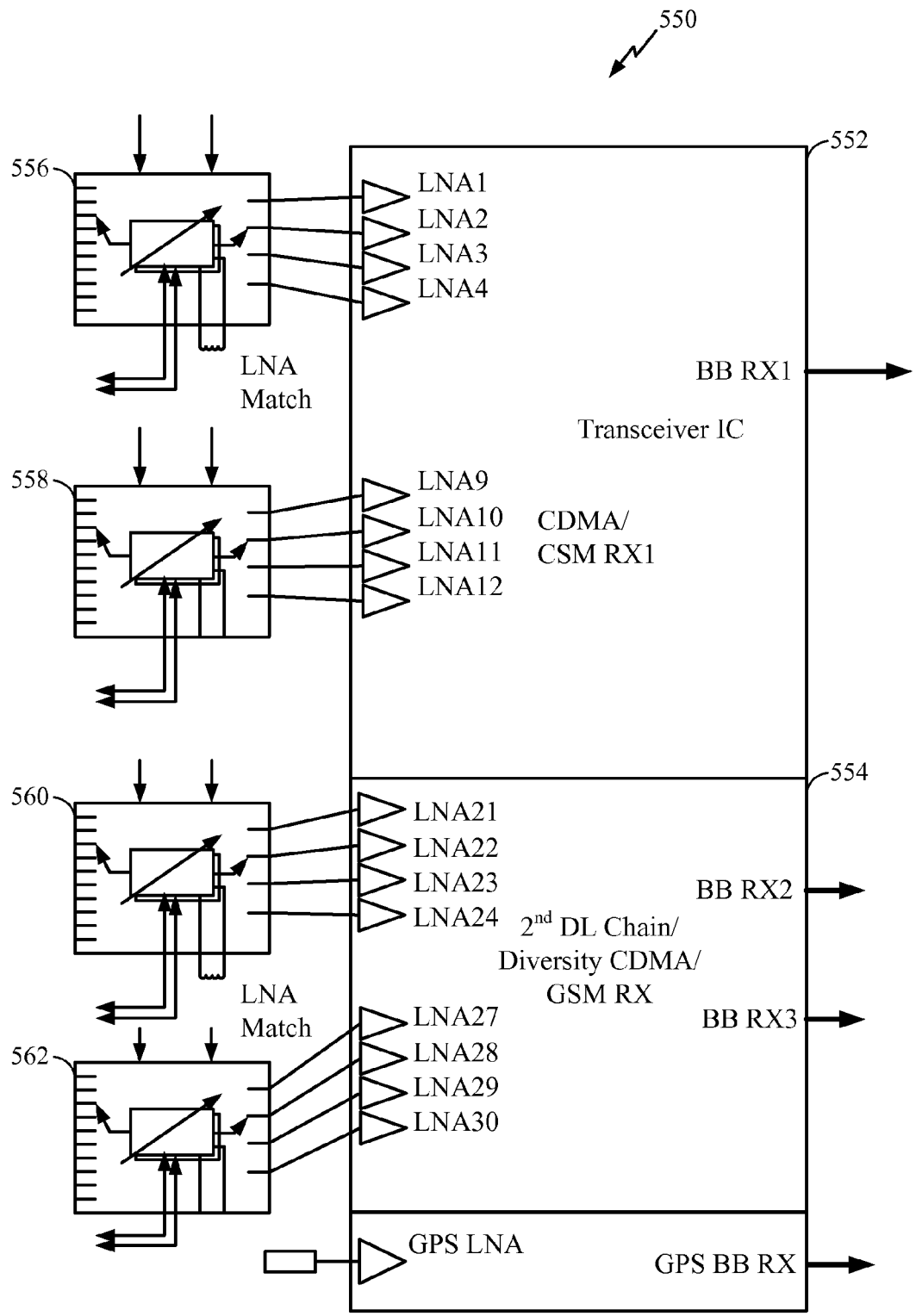
FIG. 10 depicts a device including a plurality of matching devices coupled to a transceiver module, according to an exemplary embodiment of the present invention.

FIG. 10 depicts a device 550, according to another exemplary embodiment of the present invention. Device 550 includes a primary transceiver 552 and a diversity transceiver 554. Device 550 further includes devices 556 and 558 coupled to primary transceiver 552, and devices 560 and 562 coupled to diversity transceiver 554. Each of devices 556, 558, 560, and 562 may comprise device 400 (see FIG. 6), device 450 (see FIG. 7), device 500 (see FIG. 8), or any combination thereof As illustrated in FIG. 10, each device 556, 558, 560, and 562 is configured for selectively coupling to one of a plurality of LNAs. According to one exemplary embodiment, devices 556 and 558 may replace LNA matching devices 224E, 224F, 224G, and so on (see FIG. 2B), resulting in fewer parts. Similarly, devices 560 and 562 may replace LNA matching devices 224A, 224B, 224C, 224D, and so on (see FIG. 2A), resulting in fewer parts.

Figure 11:
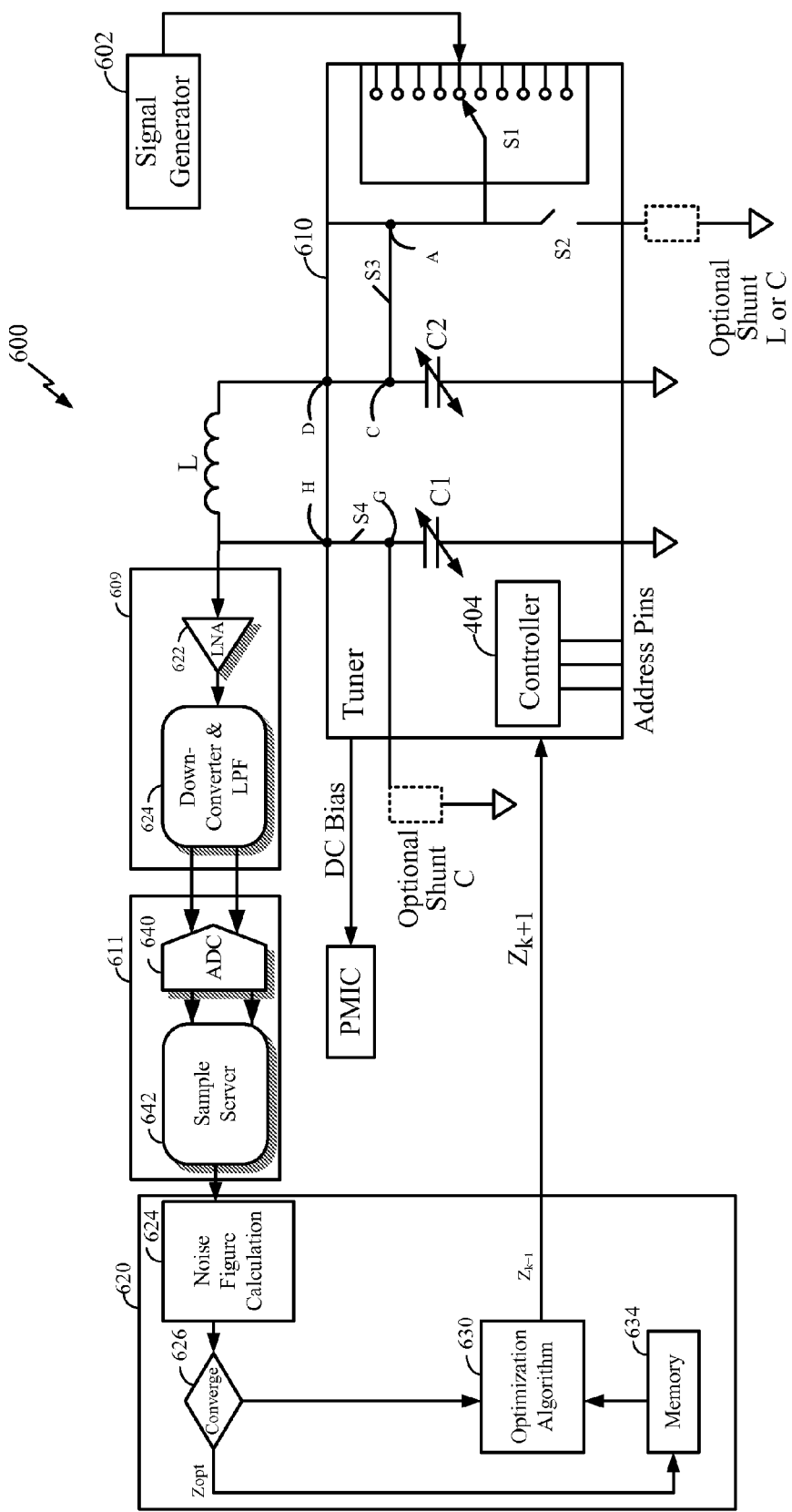
FIG. 11 depicts a system including a matching device and a low-noise amplifier, in accordance with an exemplary embodiment of the present invention.

FIG. 11 is a diagram of a system 600, in accordance with yet another exemplary embodiment of the present invention. As will be appreciated by a person having ordinary skill in the art, system 600 may be configured to select values for capacitors C1 and C2 for an optimal output SNR of an LNA given a known input SNR of the LNA. System 600 includes a signal generator 602 coupled to an input of a programmable LNA matching device 610. It is noted that programmable LNA matching device 610 may comprise one of the LNA matching devices described herein (i.e., LNA matching device 402, LNA matching device 452, or LNA matching device 502). Further, system 600 includes an inductor L, which is external to and coupled to LNA matching device 610. An output of LNA matching device 610 may connect to an LNA port, or LNA ports, of a transceiver module 609, depending on a particular embodiment. As an example, transceiver module 609 may comprise a transceiver ASIC. Transceiver module 609 includes an LNA 622 and a down-converter and low-pass filter (LPF) 624. Within transceiver module 609, an LNA RF output signal is down-converted via down-converter and LPF 624 and conveyed to a modem processor 611. Modem processor 611 includes an analog-to-digital converter (ADC) 640 and a sample server 642. ADC 640, which may be configured with a known sampling rate, may receive an output of down-converter and LPF 624 and may couple to a memory or sample server 642 that stores N samples to be read out for processing by an optimization algorithm. Sample server 642 may output data via a USB to an external PC or some other bus to an applications processor.

Module 620, which may comprise a software or algorithm module, includes a noise figure calculation unit 624, a convergence unit 626, an optimization algorithm 630, and memory 634. Noise figure calculation unit 624 may be configured to calculate a noise figure from the output SNR and output the result to convergence unit 626. It is noted that system 600 may use the output SNR in lieu of calculated noise figure. Convergence unit 626 may receive, or may be programmed with, a target noise figure or a target output SNR. Further, convergence unit 626 may keep track of previous measured noise figures, or output SNRs, and compare one or more measurements to the current measurement. When no further improvement is found in the current measurement, system 600 may store an optimal impedance Zopt in memory 634 to build a table of settings for each frequency band of operation supported by device 610. Module 620 can be part of (e.g., run on) an external PC, a digital signal processor of modem processor 611, an application processor, or any suitable combination thereof It is noted that system 600 may be configured to determine the maximum output SNR (i.e., which infers minimum or best noise figure). Knowing the input SNR allows module 620 to compute a cascaded noise figure (i.e., noise figure (dB)=SNRin(dB)−SNRout(dB)). In a properly designed receiver system, an LNA gain and noise figure may dominate the system cascaded noise figure. Those skilled in the art will understand that insufficient LNA gain allows for the subsequent parts of a receiver with high noise figure to contribute more to the system noise creating a rapid rise in cascaded noise. Maximizing system output SNR is indicative of optimal LNA signal gain and lowest system noise floor. A target noise figure or output SNR (i.e., continuous wave (CW) SNR and not the minimum detected modulated signal SNR), which may be previously determined, may be used (i.e., by convergence unit 626) for comparison to a measured noise figure (or output SNR).

An output of convergence unit 626 either triggers a new set of values for capacitors C1 and C2 if the target is not met, or outputs to memory 634 to preserve the optimal values for capacitors C1 & C2. Further, optimization algorithm unit 630 may be configured to receive stored optimization data from memory 634 and may continue to search for an optimal setting to produce an optimal result (i.e., compared to the setting stored in memory 634). The number of iterations could be determined by a step size or by a quantization of capacitor C1 and C2 step.

During a contemplated operation of system 600, LNA matching device 610 may receive a CW reference tone from signal generator 602 of known amplitude and convey an output to LNA 622. Further, noise figure measurement unit 624 may measure a noise figure of an output of LNA 622. Further, an output of convergence unit 626 is received by optimization algorithm unit 630, which may be configured to determine optimal configuration and/or settings of LNA matching device 610 based on one or more parameters of the output of LNA 622. More specifically, optimization algorithm unit 630 may be configured to determine, based on a signal received from convergence unit 626, an optimal configuration of one or more switches of LNA matching device 610 and an optimal setting for one or more variable capacitors of LNA matching device 610 to minimize the noise figure of LNA 622. It is noted that optimization algorithm unit 630 and memory 634 may be part of a digital module, such as digital module 302 illustrated in FIG. 3. Further, functionality of optimization algorithm unit 630 may be carried out by one or more processors (e.g., within a digital module).

System 600 may function as a feedback loop that terminates when convergence is met. Optimal values of variables within device 610 (e.g., values of capacitors C1 and C2) may be determined by optimization algorithm unit 630 and set by controller 404. These variables perform the role of matching an LNA to gamma opt for maximum output SNR (or minimum noise figure). After the variables are set by controller 404 via optimization algorithm unit 630, an operation of system 600 may begin and a reference tone is sent to device 610 by signal generator 602.

According to an exemplary embodiment, a CW reference tone may be internally generated and optimization algorithm 630 may select values of capacitors C1 and C2 for best possible CW SNR. Furthermore, an external reference may be used for comparison in order to determine an error in the self generated tone and, subsequently, the noise figure could be measured and optimized. This exemplary embodiment may require the optimization algorithm to run on a modem processor or application processor. As will be understood, this exemplary embodiment allows a system to self match, self test, and even adapt to new frequencies and new bands with a change in transceiver front end duplexer. Further, it may enable an original equipment manufacturer (OEM) to simply change the duplexer, run a self-match, or a self-tune optimization algorithm.

Figure 12:
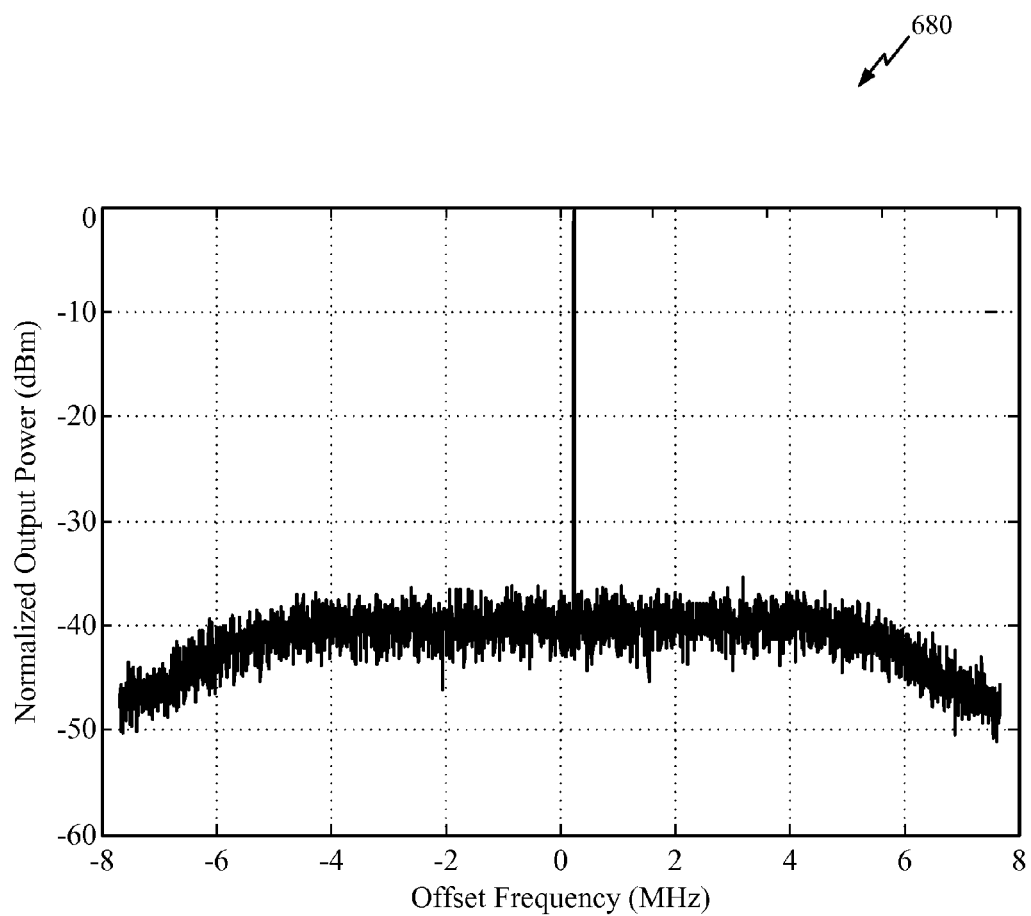
FIG. 12 is a plot illustrating an output of a noise figure measurement unit.

FIG. 12 is a plot 680 illustrating an output of noise figure calculation 624 (see FIG. 11) computed from a known input CW SNR and output SNR. With reference again to FIG. 11, if a target match (i.e., convergence) is not met when compared to a desired output SNR (or noise figure), then a new set of inputs values (i.e., values for capacitors C1 and C2) may be determined again by optimization algorithm unit 630 and set by controller 404. This process may continue until convergence is met. Optimization algorithm unit 630 may include a mathematically defined optimization algorithm (e.g., Nelder-Mead), which may find the optimal settings of capacitors C1 and C2.

Figure 13:
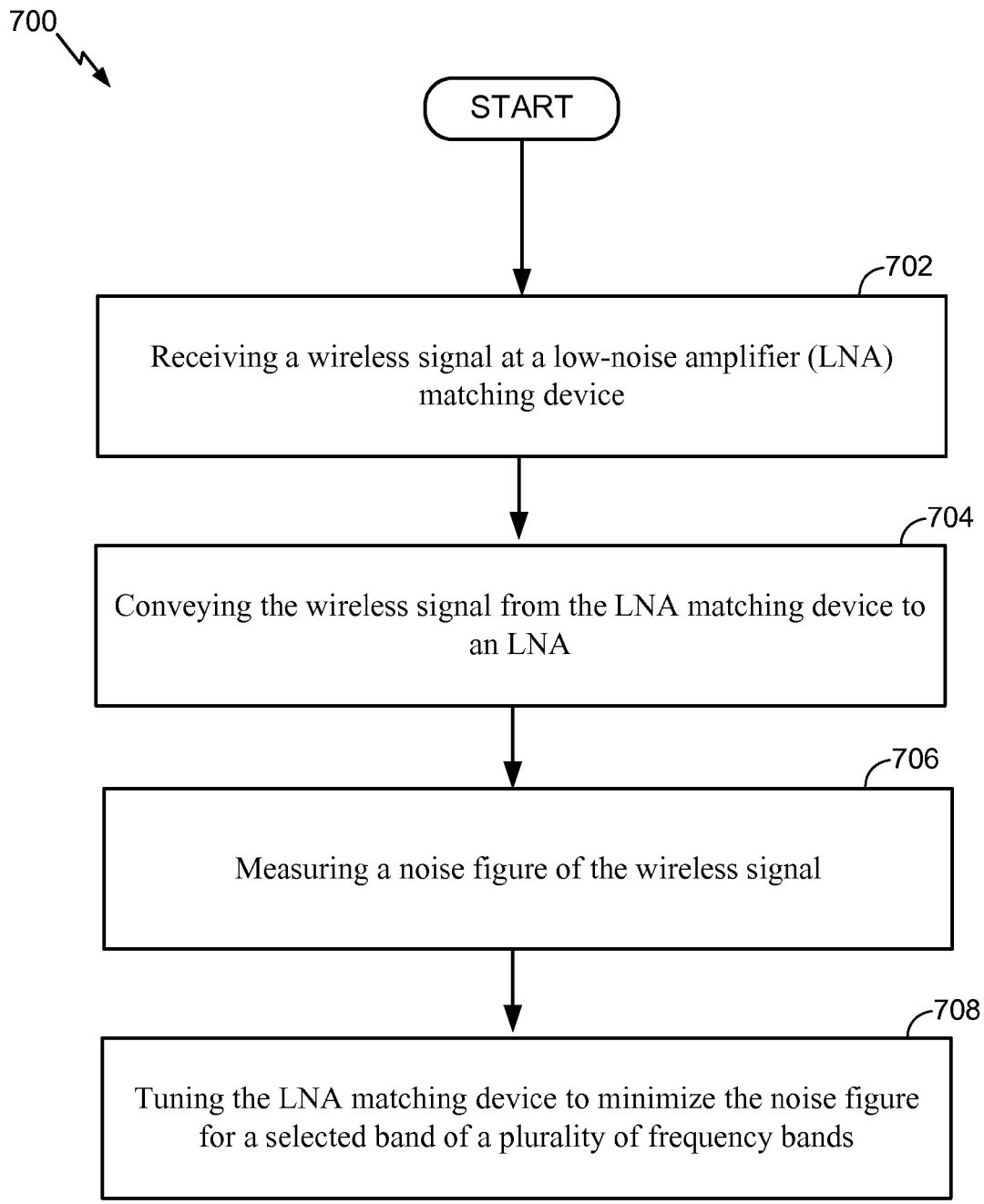
FIG. 13 is a flowchart depicting a method, in accordance with an exemplary embodiment of the present invention.

FIG. 13 is a flowchart illustrating a method 700, in accordance with one or more exemplary embodiments. Method 700 may include receiving a wireless signal at a low-noise amplifier (LNA) matching device (depicted by numeral 702). In addition, method 700 may also include conveying the wireless signal from the LNA matching device to an LNA (depicted by numeral 704). Method 700 may also include measuring a noise figure of the wireless signal (depicted by numeral 706). Furthermore, method 700 may include tuning the LNA matching device to minimize the noise figure for a selected band of a plurality of frequency bands (depicted by numeral 708).

As described herein, the present invention provides for automated LNA tuning (e.g., via on chip software) to enable an LNA to support multiple (e.g., up to ten) receive paths, thus, reducing components within a wireless communication device and associated costs. Further, various embodiments may include adaptive LNA matching or closed loop LNA matching if an internal radio-frequency (RF) reference source is available. Therefore, a system could tune or match for maximum output SNR without knowing a noise figure or knowing little about an input SNR. In addition, various embodiments could include electronically tunable filters to provide a range of frequencies for electronically tunable preselect receiver filters.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device comprising:
a plurality of low-noise amplifiers (LNAs); and
an LNA matching device coupled to the plurality of LNAs, the LNA matching device configured to receive one or more control signals and to provide an LNA match setting for a selected band of a plurality of frequency bands, the LNA matching device comprising a first variable capacitor having a first terminal switchably coupled to a first node and a second terminal coupled to a second node, the LNA matching device further comprising a second variable capacitor having a first terminal coupled to a third node and a second terminal coupled to the second node, wherein an inductor is coupled between the first node and the third node.

2. The device of claim 1, wherein the inductor is external to the LNA matching device.

3. The device of claim 2, the inductor being one of a plurality of inductors coupled between an input of the LNA matching device and an output of the LNA matching device, the plurality of inductors external to the LNA matching device.

4. The device of claim 1, the first and second capacitors comprising a digitally controlled capacitor bank.

5. The device of claim 1, further comprising a processor configured to:
measure a noise figure of a wireless signal;
determine a value associated with a component of the LNA matching device when the noise figure converges with a target noise figure; and
convey the one or more control signals to the controller of the LNA matching device, the one or more control signals indicating the value.

6. The device of claim 1, the LNA matching device comprising:
an input configured to, in a first configuration, couple the LNA matching device to a first receive path of a plurality of receive paths and, in a second configuration, to couple the LNA matching device to a second receive path of the plurality of receive paths; and
an output configured to be coupled to the plurality of LNAs.

7. The device of claim 1, the LNA matching device comprising:

an input configured to be coupled to one of a plurality of receive paths; and an output configured to, in a first configuration, couple the LNA matching device to a first LNA of the plurality of LNAs and, in a second configuration, to couple the LNA matching device to a second LNA of the plurality of LNAs.

8. The device of claim 1, the LNA matching device comprising a plurality of switches for tuning the LNA matching device.

9. The device of claim 1, the one or more control signals comprising a digital word.

10. The device of claim 1, the LNA matching device having an impedance based on the selected band.

11. The device of claim 1, the LNA matching device comprising:
   a first switch coupled between the third node and a fourth node, the fourth node coupled to an input of the LNA matching device; and
   a second switch configured to selectively couple the first variable capacitor to the first node.

12. The device of claim 1, wherein the LNA matching device is coupled to a first number of receive paths, wherein the plurality of LNAs includes a second number of LNAs, and wherein the first number is greater than the second number.

13. The device of claim 1, wherein the LNA matching device further comprises a controller configured to adjust the LNA match setting during a test mode when a noise figure of a wireless signal output by one of the plurality of LNAs exceeds a target noise figure.

14. The device of claim 1, wherein the second node is coupled to ground.

15. A method comprising:
   receiving a wireless signal at a low-noise amplifier (LNA) matching device comprising a first variable capacitor switchably coupled to a first node and a second variable capacitor coupled to a second node, wherein an inductor is coupled between the first node and the second node;
   in a first configuration, coupling an output of the LNA matching device to a first LNA of a plurality of LNAs and conveying the wireless signal from the LNA matching device to the first LNA;
   in a second configuration, coupling the output of the LNA matching device to a second LNA of the plurality of LNAs and conveying the wireless signal from the LNA matching device to the second LNA;
   measuring a noise figure of the wireless signal; and
   determining a set of LNA matching device settings based on the noise figure, the set of LNA matching device settings associated with an operating frequency band of the LNA.

16. The method of claim 15, the set of LNA matching device settings including one or more capacitances of the first variable capacitor and the second variable capacitor of the LNA matching device and one or more states of one or more switches of the LNA matching device.

17. The method of claim 15, further comprising conveying one or more control signals comprising one of a digital word and an analog control signal to the LNA matching device for tuning the LNA matching device.

18. The method of claim 15, wherein determining the set of LNA matching device settings includes iteratively adjusting the LNA matching device settings and re-measuring a noise figure until the noise figure does not exceed a target noise figure.

19. The method of claim 15, further comprising storing the set of LNA matching device settings and the operating frequency band in a lookup table.

20. A device comprising:
   means for receiving a wireless signal at a low-noise amplifier (LNA) matching device, the LNA matching device comprising a first variable capacitor having a first terminal switchably coupled to a first node and a second terminal coupled to a second node, the LNA matching device further comprising a second variable capacitor having a first terminal coupled to a third node and a second terminal coupled to the second node, wherein an inductor is coupled between the first node and the third node;
   means for conveying the wireless signal from the LNA matching device to an LNA;
   means for measuring a noise figure of the wireless signal; and
   means for determining a set of LNA matching device settings based on the noise figure, the set of LNA matching device settings associated with an operating frequency band of the LNA.

21. The device of claim 20, the LNA matching device further comprising one or more switches.

* * * * *